(12) United States Patent
Ashihara et al.

(10) Patent No.: US 9,698,050 B1
(45) Date of Patent: Jul. 4, 2017

(54) METHOD OF MANUFACTURING SEMICONDUCTOR DEVICE

(71) Applicant: HITACHI KOKUSAI ELECTRIC INC., Tokyo (JP)

(72) Inventors: Hiroshi Ashihara, Toyama (JP); Naofumi Ohashi, Toyama (JP); Tsuyoshi Takeda, Toyama (JP); Toshiyuki Kikuchi, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/223,020

(22) Filed: Jul. 29, 2016

(30) Foreign Application Priority Data

Mar. 30, 2016 (JP) ................................. 2016-068139

(51) Int. Cl.
*H01L 21/768* (2006.01)
*H01L 23/532* (2006.01)
(Continued)

(52) U.S. Cl.
CPC ........ *H01L 21/76879* (2013.01); *C23C 16/24* (2013.01); *C23F 3/04* (2013.01); *H01J 37/32009* (2013.01); *H01J 37/3244* (2013.01); *H01L 21/7685* (2013.01); *H01L 21/76832* (2013.01); *H01L 21/76834* (2013.01); *H01L 21/76841* (2013.01); *H01L 21/76846* (2013.01);
(Continued)

(58) Field of Classification Search
CPC ......... H01L 21/76849; H01L 21/76834; H01L 21/7682; H01L 21/76832; H01L 23/53238; H01L 23/53295; H01L 21/76852; H01L 21/76846; H01L 21/7685; H01L 23/5222; H01L 23/5329
See application file for complete search history.

(56) References Cited

U.S. PATENT DOCUMENTS 5,691,573 A * 11/1997 Avanzino ............ H01L 21/7682
257/642
7,741,228 B2 * 6/2010 Ueki ................... H01L 21/7682
257/E21.573
(Continued)

FOREIGN PATENT DOCUMENTS

JP 2006-334703 A 12/2006
JP 2009-016790 A 1/2009

*Primary Examiner* — Marvin Payen
*Assistant Examiner* — Jeremy Joy
(74) *Attorney, Agent, or Firm* — Volpe and Koenig, P.C.

(57) ABSTRACT

A method of manufacturing a semiconductor device includes loading, into a process chamber, a substrate including a first wiring layer having a first interlayer insulating film, a plurality of copper-containing films formed on the first interlayer insulating film and used as a wiring, an inter-wiring insulating film insulating between the plurality of copper-containing films, and a void formed between the plurality of copper-containing films, and a first diffusion barrier film formed on a portion of an upper surface of the copper-containing films to suppress diffusion of a component of the copper-containing films, and forming a second diffusion barrier film configured to suppress diffusion of a component of the copper-containing films on a surface of another portion, on which the first diffusion barrier film is not formed, in the copper-containing films.

20 Claims, 13 Drawing Sheets

(51) Int. Cl.
*H01J 37/32* (2006.01)
*C23C 16/24* (2006.01)
*C23F 3/04* (2006.01)
*H01L 23/522* (2006.01)

(52) U.S. Cl.
CPC .. *H01L 21/76849* (2013.01); *H01L 21/76852* (2013.01); *H01L 23/5222* (2013.01); *H01L 23/5329* (2013.01); *H01L 23/53238* (2013.01); *H01L 23/53295* (2013.01); *H01J 2237/334* (2013.01); *H01L 21/76898* (2013.01)

(56) References Cited

U.S. PATENT DOCUMENTS

| | | | |
|---|---|---|---|
| 8,122,405 B2 | 2/2012 | Matsumoto et al. | |
| 8,420,528 B2 | 4/2013 | Noguchi | |
| 8,586,447 B2 | 11/2013 | Noguchi et al. | |
| 9,034,664 B2 * | 5/2015 | Bonilla | H01L 21/76832 438/4 |
| 2003/0181035 A1 * | 9/2003 | Yoon | C23C 16/45525 438/653 |
| 2007/0052101 A1 * | 3/2007 | Usami | H01L 21/76801 257/758 |
| 2007/0267751 A1 * | 11/2007 | Yang | H01L 21/288 257/758 |
| 2008/0299758 A1 * | 12/2008 | Harada | H01L 21/7682 438/619 |
| 2009/0093100 A1 * | 4/2009 | Xia | C23C 16/325 438/421 |
| 2009/0093132 A1 * | 4/2009 | Xu | C23C 16/22 438/780 |
| 2010/0093168 A1 * | 4/2010 | Naik | H01L 21/31144 438/618 |
| 2010/0130001 A1 * | 5/2010 | Noguchi | H01L 21/76811 438/627 |
| 2011/0021036 A1 * | 1/2011 | Braecklmann | H01L 21/7682 438/763 |
| 2013/0113111 A1 * | 5/2013 | Lee | H01L 21/76883 257/774 |
| 2014/0048939 A1 * | 2/2014 | Park | H01L 23/53238 257/751 |
| 2015/0037980 A1 * | 2/2015 | Rha | H01L 21/306 438/700 |
| 2015/0170956 A1 * | 6/2015 | Naik | H01L 21/31116 438/703 |
| 2015/0333009 A1 * | 11/2015 | Lin | H01L 23/53223 257/751 |
| 2015/0333011 A1 * | 11/2015 | Ting | H01L 21/7685 257/751 |
| 2016/0240428 A1 * | 8/2016 | Tung | H01L 21/7682 |

\* cited by examiner

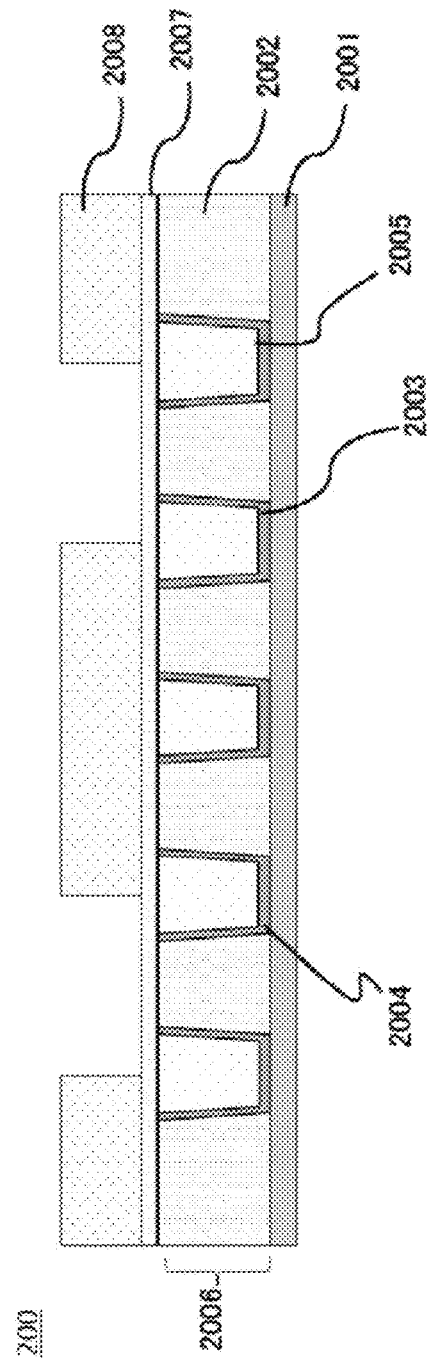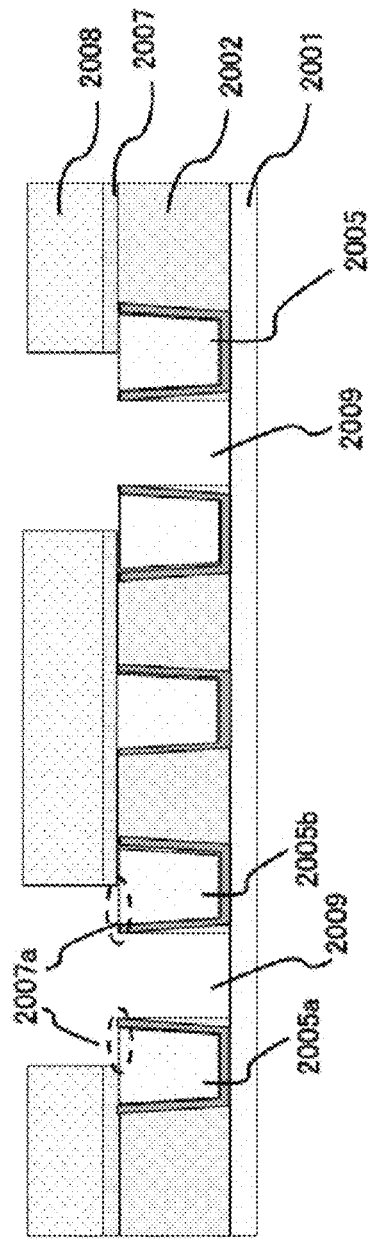

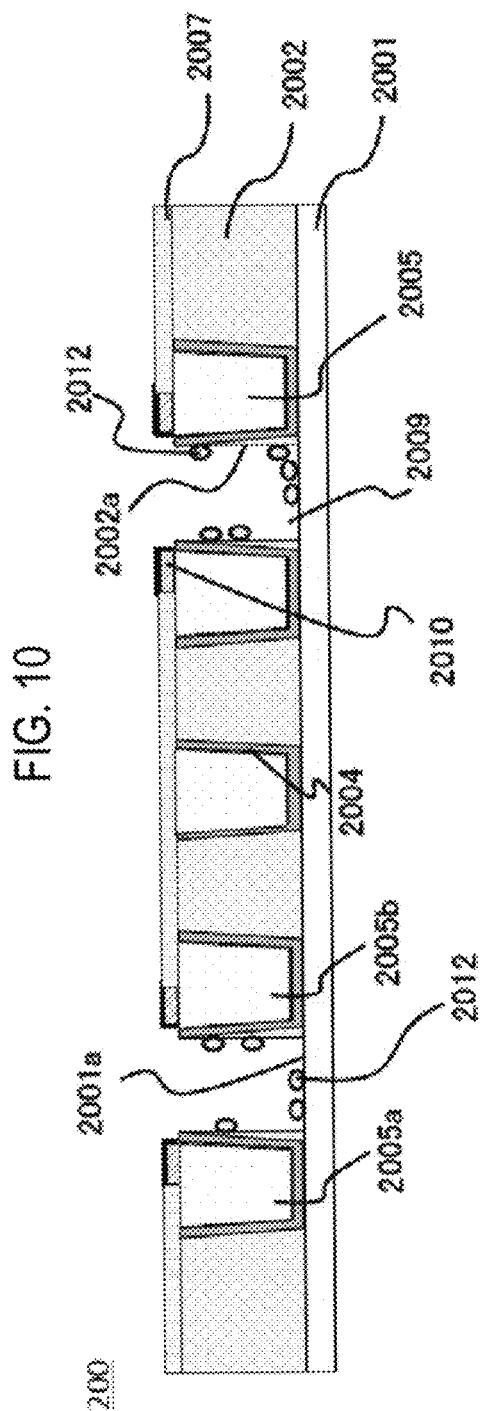

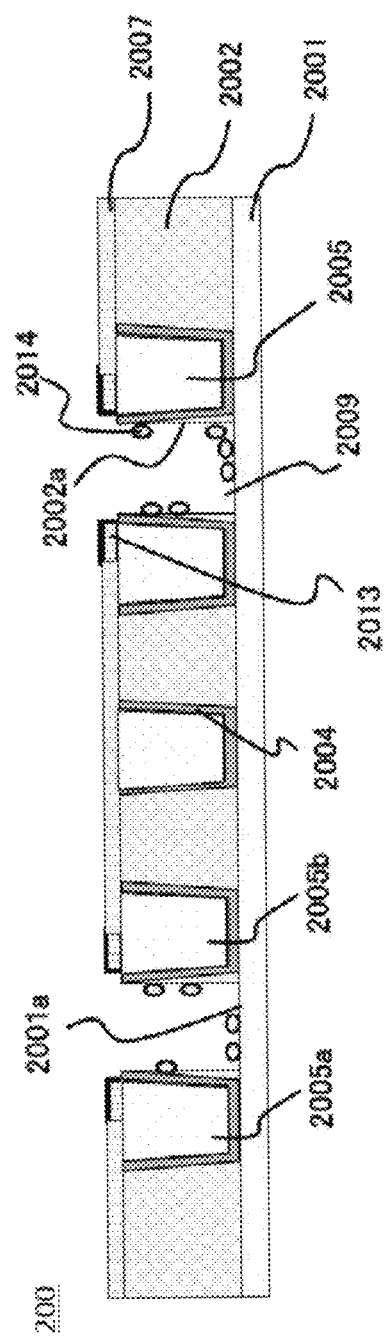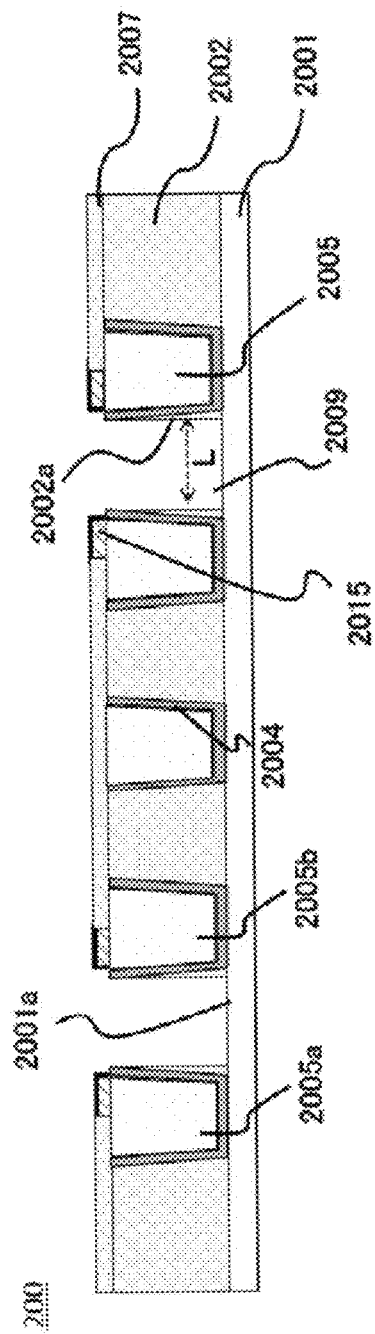

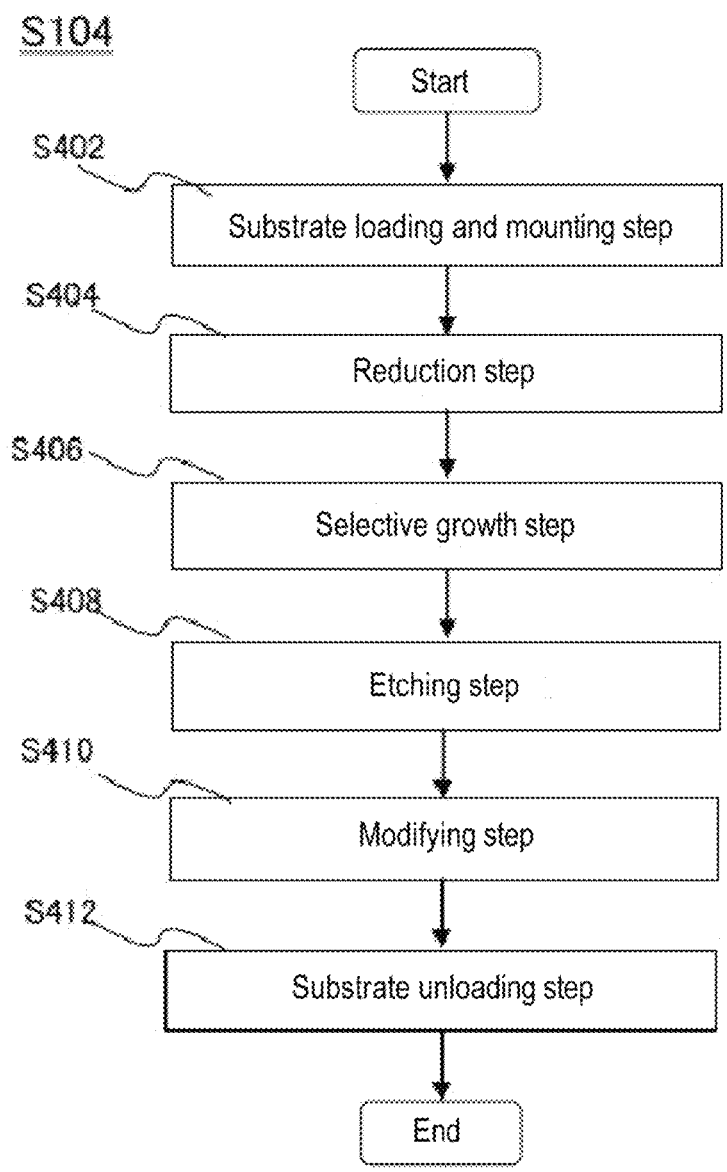

METHOD OF MANUFACTURING SEMICONDUCTOR DEVICE

CROSS-REFERENCE TO RELATED APPLICATION(S)

This application is based upon and claims the benefit of priority from Japanese Patent Application No. 2016-068139, filed on Mar. 30, 2016, the entire contents of which are incorporated herein by reference.

TECHNICAL FIELD

The present disclosure relates to a method of manufacturing a semiconductor device.

BACKGROUND

Recently, semiconductor devices tend to be highly integrated, and a space between wirings has been miniaturized according to the high integration trend. This leads to an increase of electric capacity between the wirings, degrading a general speed of a signal. Thus, the permittivity between the wirings is required to be as low as possible.

As one method for realizing low permittivity, an air gap structure in which a void is formed between wirings has been reviewed. As a method of forming a void using an air gap structure, for example, a method of etching between wirings has been used. For example, a method of forming an air gap is disclosed in the related art.

However, misalignment may occur when performing patterning due to the issue of processing accuracy. This causes a degradation of circuit characteristics.

SUMMARY

The present disclosure provides some embodiments of a technique of realizing excellent characteristics in a semiconductor device having an air gap formed thereon.

According to one embodiment of the present disclosure, there is provided a technology including: loading, into a process chamber, a substrate including a first wiring layer having a first interlayer insulating film, a plurality of copper-containing films formed on the first interlayer insulating film and used as a wiring, an inter-wiring insulating film insulating between the plurality of copper-containing films, and a void formed between the plurality of copper-containing films, and a first diffusion barrier film formed on a portion of an upper surface of the copper-containing films to suppress diffusion of a component of the copper-containing films; and forming a second diffusion barrier film configured to suppress diffusion of a component of the copper-containing films on a surface of another portion, on which the first diffusion barrier film is not formed, in the copper-containing films.

BRIEF DESCRIPTION OF THE DRAWINGS

FIGS. 4A and 4B are explanatory views illustrating a process state of a wafer according to an embodiment.

FIG. 10 is an explanatory view illustrating a process state of a wafer according to an embodiment.

FIGS. 11A and 11b are explanatory views illustrating a process state of a wafer according to an embodiment.

FIG. 13 is an explanatory view illustrating a flow of forming a second diffusion barrier film according to an embodiment.

DETAILED DESCRIPTION

First Embodiment

A first embodiment of the present disclosure will now be described.

Figure 1:
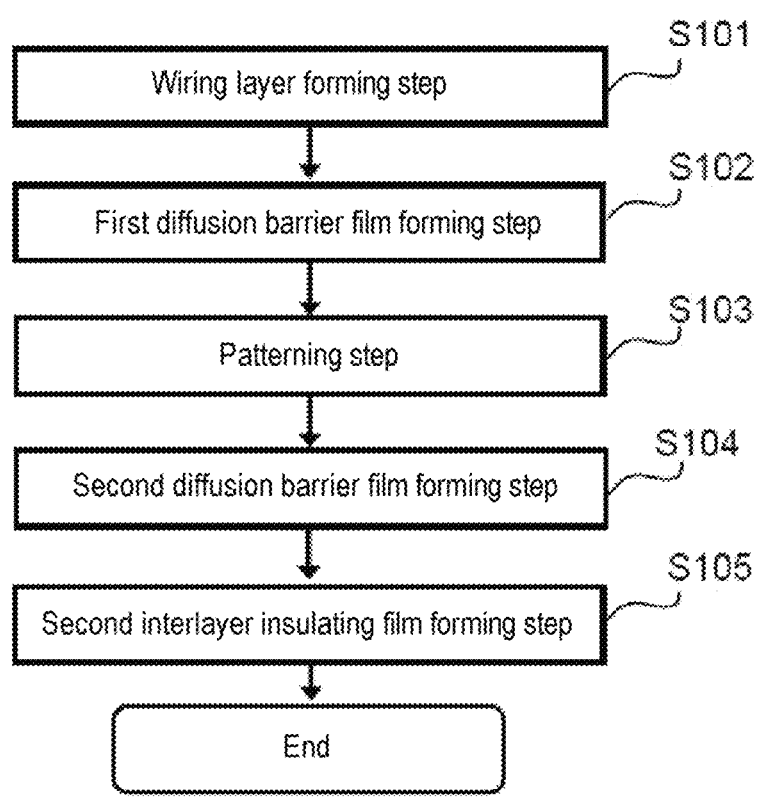
FIG. 1 is an explanatory view illustrating a manufacturing flow of a semiconductor device according to an embodiment.

One of the processes of manufacturing a semiconductor device will be described with reference to FIG. 1.
(Wiring Layer Forming Step S101)

A wiring layer forming step S101 will be described.

Figure 2:
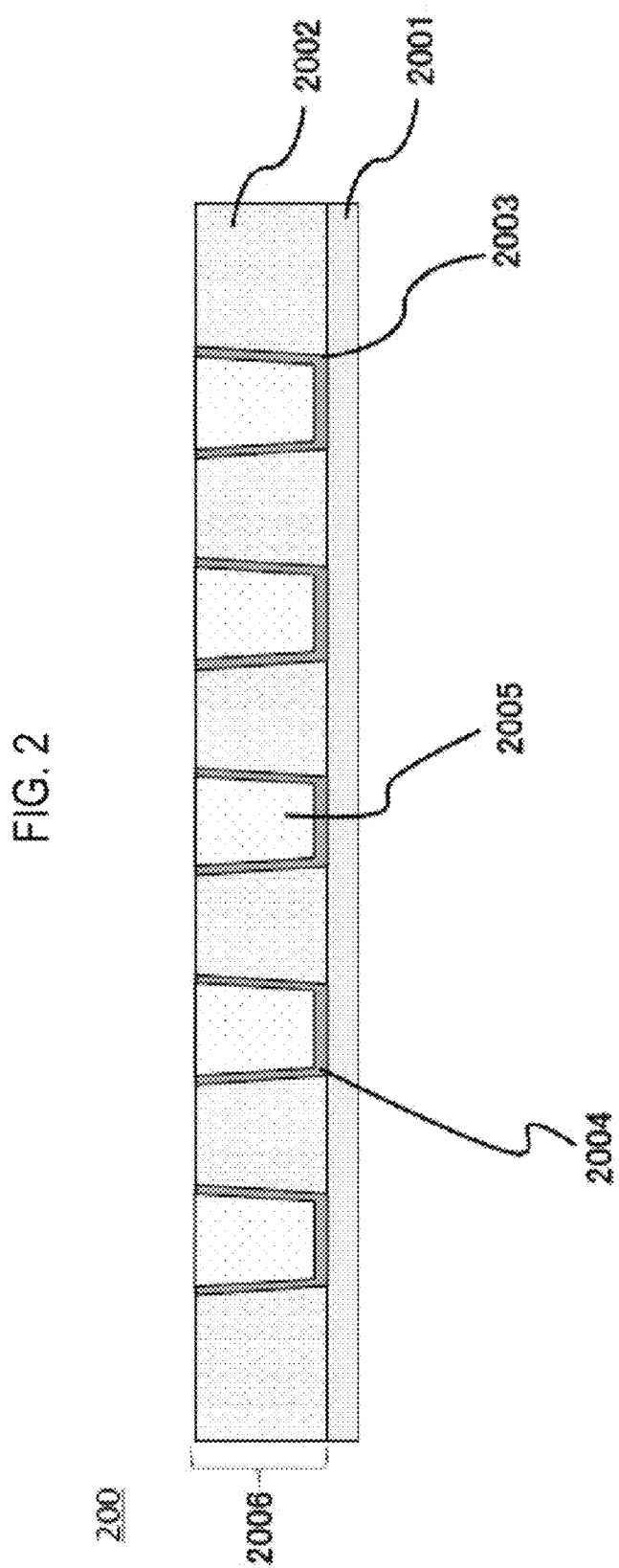
FIG. 2 is an explanatory view of a wafer according to an embodiment.

A wiring layer forming step S101 will be described with reference to FIG. 2. FIG. 2 is a view illustrating a wiring layer 2006 formed on a semiconductor wafer 200. The wiring layer 2006 is formed on an insulating film 2001. An electrode layer (not shown) is present below the insulating film 2001, and components such as a gate electrode or an anode electrode are formed in the electrode layer. The insulating film 2001 is used as an interlayer insulating film insulated from the electrode layer.

The insulating film 2001 is, for example, a porous carbon-containing silicon film (SiOC film). An inter-wiring insulating film 2002 is formed on the insulating film 2001. The inter-wiring insulating film 2002 is formed as, for example, an SiOC film.

A plurality of recesses 2003 are formed on the inter-wiring insulating film 2002, and a barrier film 2004 is formed on a surface of the recesses 2003. The barrier film 2004 is, for example, a tantalum nitride film (TaN film). A copper-containing film 2005, which is used as a wiring film, is formed on the barrier film 2004. The copper-containing film 2005 is formed of, for example, copper.

When the copper-containing film 2005 is formed, an extra copper-containing film 2005 is removed through chemical mechanical polishing (CMP) to insulate the copper-containing films 2005 formed in the respective recesses 2003 in the state of FIG. 2.

In this embodiment, the layer in which the interlayer insulating film 2001, the recesses 2003, the barrier film 2004, and the copper-containing film 2005 are formed will be referred to as a wiring layer 2006. In this embodiment, for the convenience of description, a lower wiring layer will be referred to as a first wiring layer, and a wiring layer formed above the first wiring layer will be referred to as a second wiring layer.

(First Diffusion Barrier Film Forming Step S102)

Next, a first diffusion barrier film forming step S102 will be described with reference to FIG. 3. Here, a first diffusion barrier film 2007 is formed on the wafer 200 in a state where the wiring layer 2006 of FIG. 2 is formed. The diffusion barrier film 2007 is, for example, an SiON film. The diffusion barrier film 2007 has the insulating properties and properties of suppressing diffusion. Specifically, by forming the first diffusion barrier film 2007, it is possible to suppress diffusion of a component of the copper-containing film 2005 to an upper layer. Further, when a space between wirings is remarkably narrow, there may be a possibility that the wirings (copper-containing film 2005) will be conducted to each other through the upper layer formed on the wiring layer 2006, but such a possibility can be suppressed.

(Patterning Step S103)

Subsequently, a patterning step S103 will be described.

Figure 3:
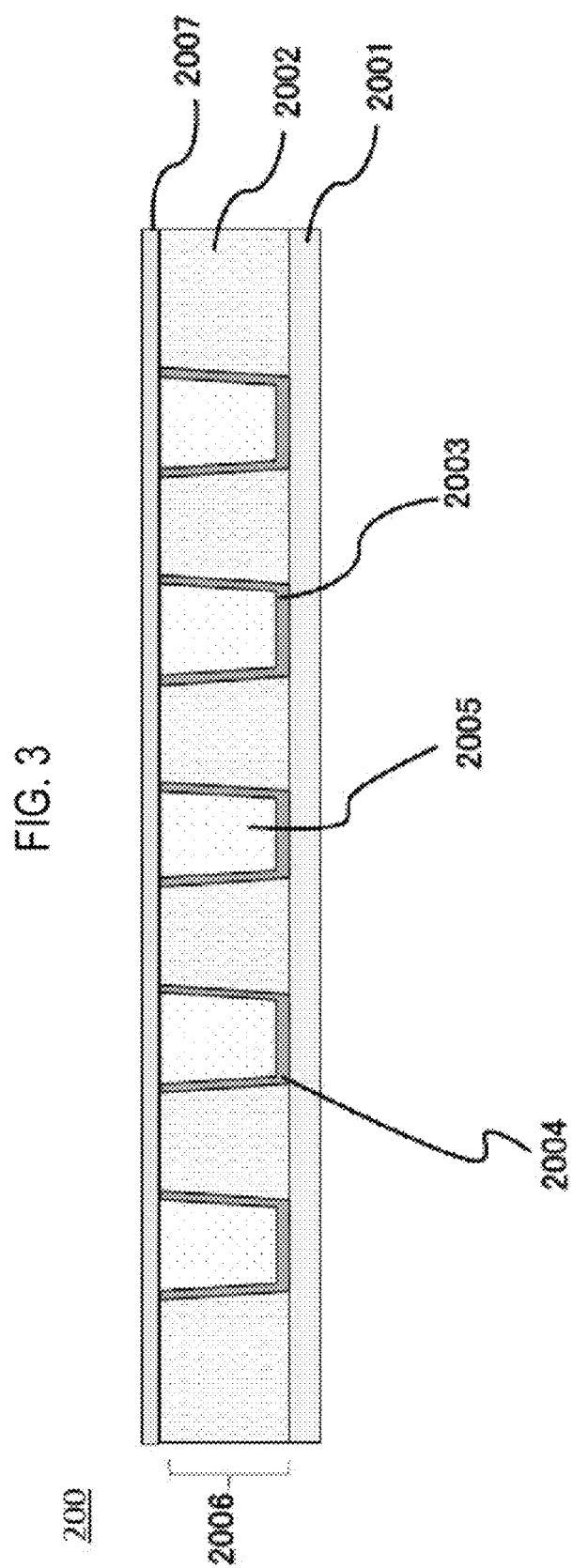
FIG. 3 is an explanatory view illustrating a process state of a wafer according to an embodiment.

Here, the wafer 200 in a state where the diffusion barrier film 2007 illustrated in FIG. 3 is formed is processed. First, a patterning resist layer 2008 is formed on the diffusion barrier film 2007. Thereafter, exposing is performed to form the resist layer 2008 having a desired pattern as illustrated in FIG. 4A.

After the resist layer 2008 having a desired pattern is formed, etching is performed thereon to etch a portion of the inter-wiring insulating film 2002 to form a void 2009 between the copper-containing films 2005 as illustrated in FIG. 4B. For example, the void 2009 is formed between a copper-containing film 2005a and a copper-containing film 2005b. The void 2009 is configured as an air gap later.

After the void 2009 is formed, the resist layer 2008 is removed.

Here, the air gap will be described.

According to the recent miniaturization and densification, a distance between wirings has been reduced. Then, condenser capacity may be increased between the wirings to cause a signal delay. In this case, as in the related art, charging an insulating material having low permittivity between the wirings may be considered, which, however, has a physical limitation. In order to avoid this, a void called an air gap is formed between the wirings to lower permittivity.

(Second Diffusion Barrier Film Forming Step S104)

However, a distance between wirings on a device becomes reduced due to the recent miniaturization and densification, and accordingly, exposure precision is at or near the limit and misalignment may easily occur. When misalignment occurs, for example, a portion of the diffusion barrier film 2007 on the copper-containing film 2005, as well as between the copper-containing films 2005, is etched to expose an etched portion 2007a as illustrated in FIG. 4B.

After the resist layer 2008 is removed, in a state where a portion of the copper-containing film 2005 is exposed, when an interlayer insulating film is formed on the copper-containing film 2005, a leak current occurs in the interlayer insulating film above the exposed surface of the copper-containing film 2005 and it is conducted with the copper-containing film 2005 adjacent thereto. For example, the copper-containing film 2005 and the copper-containing film 2005b may be conducted. Alternatively, a metal (copper) component may be diffused to the upper interlayer insulating film. This problem degrades the characteristics of the device.

Figure 5:
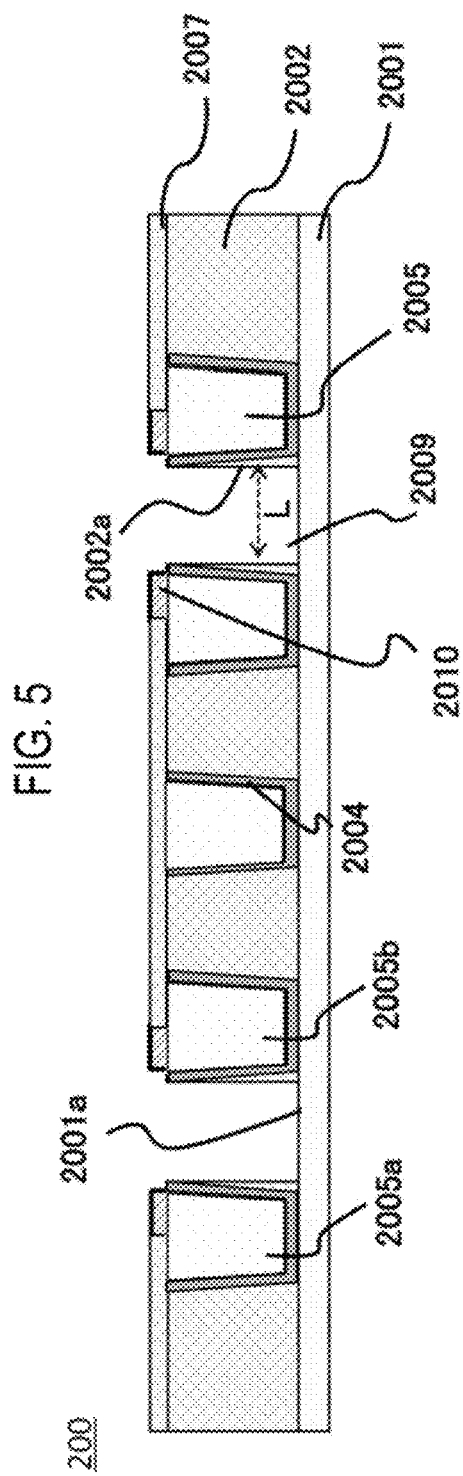
FIG. 5 is an explanatory view illustrating a process state of a wafer according to an embodiment.

Thus, in this embodiment, after the resist layer 2008 is removed, a second diffusion barrier film 2010 is formed at least on the etched portion (exposed surface of the copper-containing film 2005a), as illustrated in FIG. 5. A method for forming the diffusion barrier film 2010 will be described later.

In this manner, the first diffusion barrier film and the second diffusion barrier film are formed. The properties of these diffusion barrier films are again summarized as follows. That is, the first diffusion barrier film is formed on a portion of the upper surface of the copper-containing film and has the property of suppressing diffusion of a component of the copper-containing film from the copper-containing film to the second wiring layer formed on the first wiring layer through a partial surface. The second diffusion barrier film has the property of suppressing diffusion of a component of the copper-containing film from the copper-containing film to the second wiring layer through the exposed surface on the exposed surface of the copper-containing film on which the first diffusion barrier film is not formed.

(Second Interlayer Insulating Film Forming Step S105)

Figure 6:
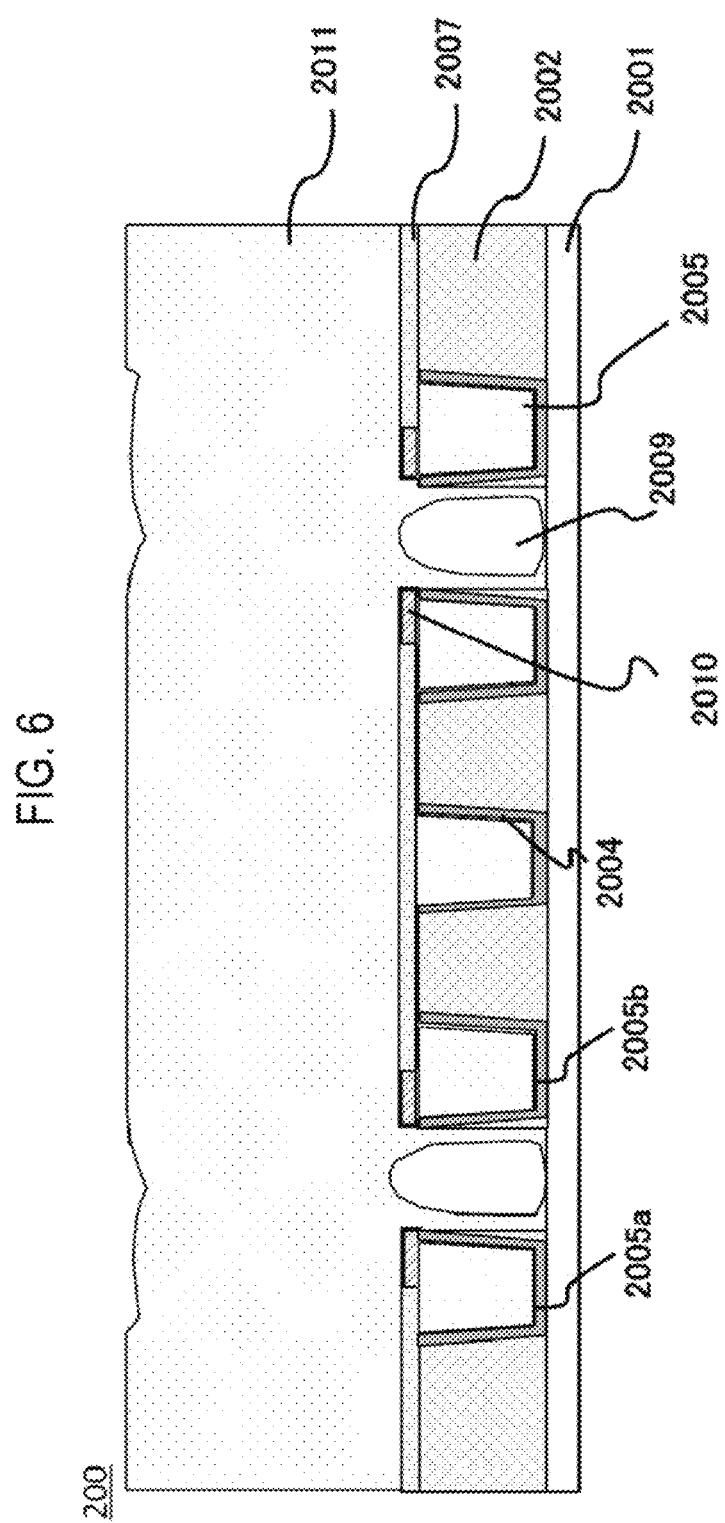
FIG. 6 is an explanatory view illustrating a process state of a wafer according to an embodiment.

Next, a second interlayer insulating film forming step S105 of forming an interlayer insulating film 2011 on the diffusion barrier film 2010 will be described. After the diffusion barrier film 2010 is formed, as illustrated in FIG. 6, an interlayer insulating film 2011 is formed on the diffusion barrier film 2010. The interlayer insulating film 2011 is, for example, a carbon-containing silicon oxide film (SiOC film). When forming the interlayer insulating film, for example, a method in which a silicon-containing gas and an oxygen-containing gas are supplied onto the wafer 200 in a vapor phase reaction and subsequently doping carbon may be considered.

Next, the reason why the interlayer insulating film 2011 is formed in a state where the void 2009 is secured in this step will be described below.

As described above, when the space between the wirings is very narrow, as the deposition of the interlayer insulating film 2011 is in progress, it becomes difficult for a gas to go inside since the gas is hindered by the deposit near the upper portion of the diffusion barrier film 2007, so that it has to detour to the downside. Accordingly, a deposit speed below the void 2009 becomes lower than that above the diffusion barrier film 2007. The film forming process is continued in this state in order to secure the void 2009. The secured void 2009 is used as an air gap.

Next, a substrate processing apparatus used in the second diffusion barrier film forming step S104, and a method of forming a diffusion barrier film will be described. The method of forming a second diffusion barrier film is a part of a method of manufacturing a semiconductor and also a part of a substrate processing method.

(Substrate Processing Apparatus)

First, a substrate processing apparatus 100 will be described with reference to FIG. 7. In this embodiment, the substrate processing apparatus 100 forms the diffusion barrier film 2010.

A chamber 202 forming the substrate processing apparatus 100 is configured as a flat airtight vessel having a circular cross-section. Further, the chamber 202 is formed of a metal material such as, for example, aluminum (Al) or stainless steel (SUS). A process space 201 in which the wafer 200 such as a silicon wafer as a substrate is processed, and a transfer space 203 through which the wafer 200 passes when the wafer 200 is transferred to the process space 201 are formed in the chamber 202. The chamber 202 is configured by an upper vessel 202a and a lower vessel 202b. A partition plate 204 is installed between the upper vessel 202a and the lower vessel 202b.

A substrate loading/unloading port 206 adjacent to a gate valve 205 is installed on a side surface of the lower vessel 202b, and the wafer 200 moves into and out of a transfer chamber (not shown) through the substrate loading/unloading port 206. A plurality of lift pins 207 are installed in a bottom portion of the lower vessel 202b.

A substrate support part 210 configured to support the wafer 200 is installed in the process space 201. The substrate support part 210 mainly includes a mounting surface 211 on which the wafer 200 is mounted, a mounting table 212 having the mounting surface 211 on a surface thereof, and a heater 213 as a heating source included in the substrate mounting table 212. Through holes 214 through which the lift pins 207 pass are formed in the substrate mounting table 212 at positions corresponding to the lift pins 207, respectively. A heater temperature control part 220 configured to control a condition of current applying thereto is connected to the heater 213.

The substrate mounting table 212 is supported by a shaft 217. A support part of the shaft 217 passes through a hole 215 formed in a bottom wall of the chamber 202 and is connected to an elevation mechanism 218 outside the chamber 202 through a support plate 216. By operating the elevation mechanism 218 to elevate or lower the shaft 217 and the substrate mounting table 212, the wafer 200 mounted on the substrate mounting surface 211 can be elevated or lowered. Further, the periphery of a lower end portion of the shaft 217 is covered with a bellows 219. The inside of the chamber 202 is kept airtight.

Figure 7:
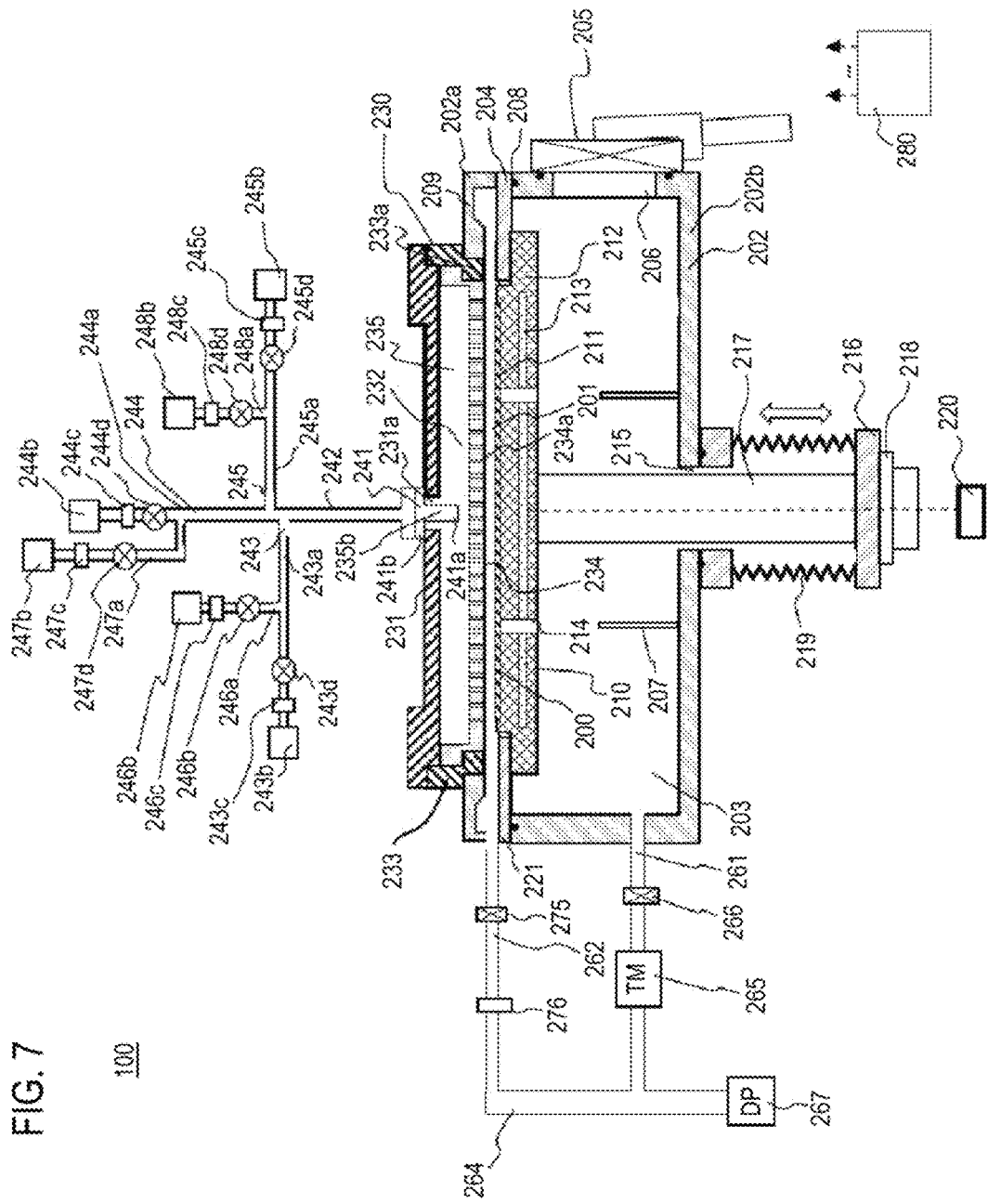
FIG. 7 is an explanatory view illustrating a substrate processing apparatus according to an embodiment.

The substrate mounting table 212 is lowered to a position (wafer transfer position) such that the substrate mounting surface 211 faces the substrate loading/unloading port 206 when the wafer 200 is transferred, and is elevated until the wafer 200 reaches a processing position (wafer processing position) thereof within the process space 201, as illustrated in FIG. 7, when the wafer 200 is processed.

Specifically, when the substrate mounting table 212 is lowered to the wafer transfer position, an upper end portion of the lift pins 207 protrudes from an upper surface of the substrate mounting surface 211 so that the lift pins 207 support the wafer 200 from below. Further, when the substrate mounting table 212 is elevated to the wafer processing position, the lift pins 207 are buried from the upper surface of the substrate mounting surface 211 so that the substrate mounting surface 211 supports the wafer 200 from below. In addition, since the lift pins 207 are in direct contact with the wafer 200, the lift pins 207 are preferably formed of a material such as, for example, quartz or alumina.

A shower head 230 as a gas dispersion mechanism is installed in an upper portion (upstream side) of the process space 201. A through hole 231a into which a first dispersion mechanism 241 is inserted is formed in a lid 231 of the shower head 230. The first dispersion mechanism 241 includes a front end portion 241a that is inserted into the shower head and a flange 241b that is fixed to the lid 231.

The front end portion 241a is configured to have a columnar shape, for example, a cylinder shape. A dispersion hole is formed on a side surface of the cylinder. A gas supplied from a gas supply part (supply system) of the chamber described later is supplied to the buffer space 232a through the front end portion 241a.

The shower head 230 includes a dispersion plate 234 as a second dispersion mechanism for dispersing a gas. An upstream side of the dispersion plate 234 is the buffer space 232 and a downstream side thereof is the process space 201. A plurality of through holes 234a is formed in the dispersion plate 234. The dispersion plate 234 is disposed to face the substrate mounting surface 211.

The dispersion plate 234 is configured to have, for example, a disk shape. The through holes 234a are installed in the entire surface of the dispersion plate 234. Adjacent through holes 234a are disposed at, for example, equal distance, and the through hole 234a disposed in the outermost periphery is disposed on an outer side than the periphery of a wafer mounted on the substrate mounting table 212.

The upper vessel 202a has a flange, and a support block 233 is mounted on the flange and fixed thereto. The support block 233 has a flange 233a, and the dispersion plate 234 is mounted on the flange 233a and fixed thereto. Further, the lid 231 is fixed to the upper surface of the support block 233. With such a structure, the lid 231, the dispersion plate 234, and the support block 233 can be removed in this order from above.

(Supply System)

The first dispersion mechanism 241 is connected to the gas introduction hole 231a which is formed in the lid 231 of the shower head 230. A common gas supply pipe 242 is connected to the first dispersion mechanism 241. A flange is installed in the first dispersion mechanism 241, and fixed to the lid 231 and to the flange of the common gas supply pipe 242 with a screw or the like.

The first dispersion mechanism 241 and the common gas supply pipe 242 communicate inside the pipes, and thus, a gas supplied from the common gas supply pipe 242 is supplied into the shower head 230 through the first dispersion mechanism 241 and the gas introduction hole 231a.

A first gas supply pipe 243a, a second gas supply pipe 244a, and a third gas supply pipe 245a are connected to the common gas supply pipe 242.

A first element-containing gas is mainly supplied from a first gas supply system 243 including the first gas supply pipe 243a, and a second element-containing gas is mainly supplied from a second gas supply system 244 including the second gas supply pipe 244a.

(First Gas Supply System)

A first gas supply source 243b, a mass flow controller (MFC) 243c, which is a flow rate controller (flow rate control part), and a valve 243d, which is an opening/closing valve, are installed in the first gas supply pipe 243a in this order from an upstream direction.

A gas containing a first element (hereinafter, referred to as a "first element-containing gas") is supplied from the first gas supply pipe 243a into the shower head 230 through the MFC 243c, the valve 243d, and a common gas supply pipe 242.

The first element-containing gas is, for example, a hydrogen ($H_2$) gas, and is a reduction gas, i.e., one of process gases. Here, the first element is, for example, hydrogen (H). That is, the first element-containing gas is, for example, a hydrogen-containing gas.

A downstream end of the first inert gas supply pipe 246a is connected to the first gas supply pipe 243a at a downstream side of the valve 243d. An inert gas supply source 246b, an MFC 246c, which is a flow rate controller (flow rate control part), and a valve 246d, which is an opening/closing valve, are installed in the first inert gas supply pipe 246a in this order from the upstream direction. The inert gas acts as a carrier gas or a dilution gas in a reduction step S304 and a selective growth step S306.

Here, the inert gas is, for example, a nitrogen ($N_2$) gas. Also, as the inert gas, a rare gas such as, for example, a helium (He) gas, a neon (Ne) gas, or an argon (Ar) gas, in addition to the $N_2$ gas, may be used.

A first element-containing gas supply system 243 is mainly configured by the first gas supply pipe 243a, the MFC 243c, and the valve 243d.

Further, a first inert gas supply system is mainly configured by the first inert gas supply pipe 246a, the MFC 246c, and the valve 246d. Also, it may be considered that the inert gas supply source 246d and the first gas supply pipe 243a are included in the first inert gas supply system.

In addition, it may be considered that the first gas supply source 243b and the first inert gas supply system are included in the first element-containing gas supply system 243.

(Second Gas Supply System)

A second gas supply source 244b, an MFC 244c, which is a flow rate controller (flow rate control part), and a valve 244d, which is an opening/closing valve, are installed in the second gas supply pipe 244a in this order from the upstream direction.

A gas containing a second element (hereinafter, referred to as a "second element-containing gas") is supplied from the second gas supply pipe 244a into the shower head 230 though the MFC 244c, the valve 244d, and the common gas supply pipe 242.

The second element-containing gas is one of the process gases. The second element-containing gas has selectivity regarding film formation in that it easily grows a film on the copper-containing film 2005 while having difficulty in growing a film on the inter-wiring insulating film 2002. In other words, the second element-containing gas is a gas that can be selectively grown on the copper-containing film 2005. For example, the second element-containing gas is a gas containing a transition metal. Since the transition metal has a property that can be easily precipitated, it easily reacts with the copper-containing film and has difficulty in reacting with the insulating film. Thus, it can be selectively grown.

Here, the second element-containing gas contains a second element different from the first element. The second element is a transition metal, for example, tungsten (W). As the second element-containing gas, for example, a tungsten hexafluoride ($WF_6$) gas is used.

Here, the reason why the second element-containing gas has selectivity between the copper-containing film 2005 and the inter-wiring insulating film 2002 will be described.

Tungsten has a property of selectively growing in a region having a large number of active sites. In this embodiment, the region having a large number of active sites refers to an exposed portion of the copper-containing film 2005. In the exposed portion, electrons may easily migrate according to an outmost reaction, which becomes actives sites. Meanwhile, electrons have difficulty migrating on the surface of the inter-wiring insulating film 2002 or the first interlayer insulating film 2001, which, thus, makes it difficult to become active sites. That is, a side surface 2002a of the inter-wiring insulating film 2002 forming a side surface of the recess 2009 and the surface 200a of the interlayer insulating film 2001 forming a bottom surface of the recess 2009 have difficulty in becoming active sites. Due to this relationship, a tungsten film is grown on the surface of the exposed surface of the copper-containing film 2005, but is not grown on the surface of the inter-wiring insulating film 2002. Any metal-containing gas having such features may be used, without being limited to the $WF_6$ gas.

The second element-containing gas supply system 244 (also referred to as a metal-containing gas supply system is mainly configured by the second gas supply pipe 244a, the MFC 244c, and the valve 244d.

Further, a downstream end of the second inert gas supply pipe 247a is connected to the second gas supply pipe 244a at a downstream side of the valve 244d. An inert gas supply source 247b, an MFC 247c, which is a flow rate controller (flow rate control part), and a valve 247d, which is an opening/closing valve, are installed in the second inert gas supply pipe 247a in this order from the upstream direction.

An inert gas is supplied from the second inert gas supply pipe 247a into the shower head 230 through the MFC 247c, the valve 247d, and the second gas supply pipe 247a. The inert gas acts as a carrier gas or a dilution gas in the second diffusion barrier film forming step S104.

A second inert gas supply system is mainly configured by the second inert gas supply pipe 247a, the MFC 247c, and the valve 247d. Also, it may be considered that the inert gas supply source 247b is included in the second inert gas supply system.

In addition, it may also be considered that the second gas supply source 247b and the second inert gas supply system are included in the second element-containing gas supply system 244.

(Third Gas Supply System)

A third gas supply source 245b, an MFC 245c, which is a flow rate controller (flow rate control part), and a valve 245d, which is an opening/closing valve, are installed in the third gas supply pipe 245a in this order from the upstream direction.

An inert gas as a purge gas is supplied from the third gas supply pipe 245a into the shower head 230 though the MFC 245c, the valve 245d, and the common gas supply pipe 242.

Here, the inert gas is, for example, a nitrogen ($N_2$) gas. Also, as the inert gas, a rare gas such as, for example, a helium (He) gas, a neon (Ne) gas, or an argon (Ar) gas, in addition to the $N_2$ gas, may be used.

A downstream end of an etching gas supply pipe 248a is connected to the third gas supply pipe 245a at a downstream side of the valve 245d. An etching gas supply source 248b, an MFC 248c, which is a flow rate controller (flow rate control part), and a valve 248d, which is an opening/closing valve, are installed in the etching gas supply pipe 248a in this order from the upstream direction. The etching gas has the property of removing the tungsten-containing film, and is, for example, a fluoride-containing gas, which is an $NF_3$ gas.

A third gas supply system 245 is mainly configured by the third gas supply pipe 245a, the MFC 245c, and the valve 245d.

Further, an etching gas supply system is mainly configured by the etching gas supply pipe 248a, the MFC 248c, and the valve 248d. Also, it may be considered that the etching gas supply source 248b and the third gas supply pipe 245a are included in the etching gas supply system.

In addition, it may be considered that the third gas supply source 245b and the etching gas supply system are included in the third gas supply system 245.

In the selective growth step S306, an inert gas is supplied from the third gas supply pipe 245a into the shower head 230 through the MFC 245c, the valve 245d, and the common gas supply pipe 242. Further, in the etching step, an etching gas is supplied into the shower head 230 through the MFC 248c, the valve 248d, and the common gas supply pipe 242.

In the substrate processing process, the inert gas supplied from the third gas supply source 245b acts as a purge gas for purging a gas collected in the chamber 202 or the shower head 230. Also, in the etching step, the inert gas may act as a carrier gas or a dilution gas of the etching gas.

In the etching step, the etching gas supplied from the etching gas supply source 248b etches a tungsten film having an island shape formed on the wafer 200.

The etching gas is, for example, a nitrogen trifluoride ($NF_3$) gas, and as the etching gas, a chlorine trifluoride ($ClF_3$) gas or the like may be used, or any combination thereof may also be used.

(Exhaust System)

An exhaust system configured to exhaust the atmosphere from the chamber 202 includes a plurality of exhaust pipes connected to the chamber 202. Specifically, the exhaust system includes an exhaust pipe 262 connected to the process space 201 and an exhaust pipe 261 connected to the transfer space 203. Further, an exhaust pipe 264 is connected to the downstream side of each of the exhaust pipes 261 and 262.

The exhaust pipe 261 is installed on the side surface or the bottom surface of the transfer space 203. A turbo molecular pump 265 is installed in the exhaust pipe 261. In the exhaust pipe 261, a valve 266 as a first exhaust valve for the transfer space is installed at the upstream side of the turbo molecular pump 265.

The exhaust pipe 262 is installed at the side of the process space 201. An auto pressure controller (APC) 276, which is a pressure controller configured to control the inside of the process space 201 to a predetermined pressure, is installed in the exhaust pipe 262. The APC 276 includes a valve body (not shown) with an adjustable degree of opening, and adjusts the conductance of the exhaust pipe 262 according to the instructions from a controller 280 described later. Further, in the exhaust pipe 262, a valve 275 is installed at the upstream side of the APC 276. The exhaust pipe 263, the valve 275 and the APC 276 are collectively referred to as a process chamber exhaust part.

A dry pump (DP) 267 is installed in the exhaust pipe 264. As shown, the exhaust pipe 262 and the exhaust pipe 261 are connected to the exhaust pipe 264 from the upstream side thereof, and the DP 267 is installed at the downstream side thereof. The DP 267 exhausts the atmosphere from each of the process space 201 and the transfer space 203 through each of the exhaust pipe 262 and the exhaust pipe 261. Further, when the TMP 265 is actuated, the DP 267 also serves as an auxiliary pump thereof. That is, for the TMP 265, which is a high vacuum (or ultra-high vacuum) pump, since it is difficult to perform the exhaust to an atmospheric pressure by itself, the DP 267 is used as an auxiliary pump that performs the exhaust to the atmospheric pressure. In each valve of the exhaust system described above, for example, an air valve is used.

(Controller)

Figure 8:
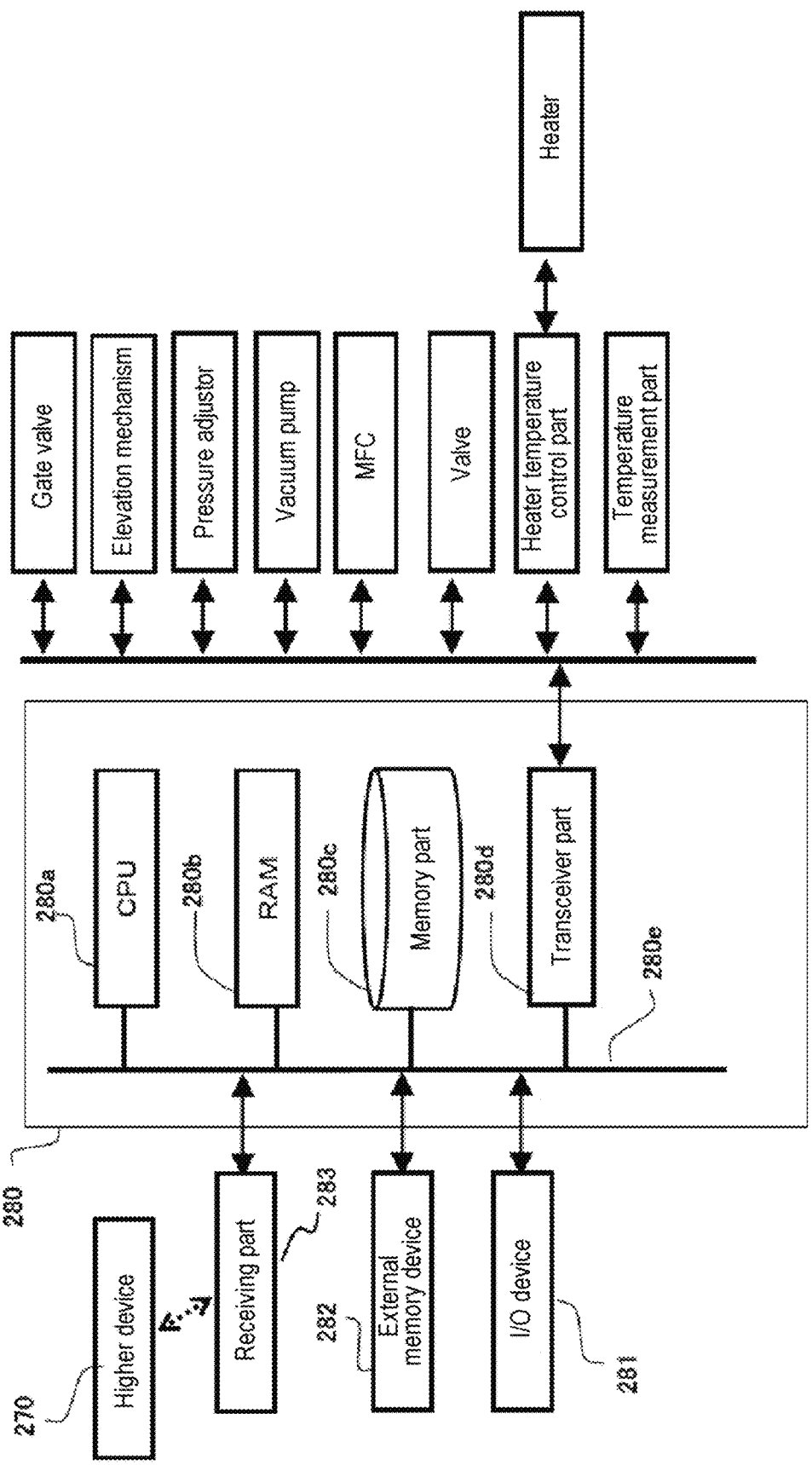
FIG. 8 is an explanatory view illustrating a substrate processing apparatus according to an embodiment.

The substrate processing apparatus 100 includes the controller 280 that controls the operation of each part of the substrate processing apparatus 100. As illustrated in FIG. 8, the controller 280 includes at least a computing part (CPU) 280a, a temporary memory part 280b, a memory part 280c, and a transceiver part 280d. The controller 280 is connected to each of the components of the substrate processing apparatus 100 through the transceiver part 280d, and is configured to invoke a program or a recipe from the memory part 280c according to the instructions from a higher controller or a user and control the operation of each of the components depending on the contents thereof. Further, the controller 280 may be configured as a dedicated computer or may be configured as a general-purpose computer. For example, the controller 280 according to this embodiment may be configured by preparing an external recording medium 363 such as an external memory device (for example, a magnetic tape, a magnetic disc such as a flexible disc or a hard disc, an optical disc such as a CD or DVD, a magneto-optical disc such as an MO, or a semiconductor memory such as a USB memory (USB Flash Drive) or a memory card) 282, in which the program is stored, and installing the program on the general-purpose computer using the external memory device 282. Further, a means for supplying a program to a computer is not limited to a case in which the program is supplied through the external memory device 282. For example, the program may be supplied by using a communication means such as the Internet or a dedicated line, or receiving information from the higher device 270 through a receiving part 283, rather than through the external memory device 282. The program may be supplied by instructing the controller 280 using an input/output device 281 such as a keyboard or touch panel.

Further, the memory part 280c or the external memory device 282 is configured as a non-transitory computer-readable recording medium. Hereinafter, these will be collectively referred to simply as a "recording medium". In addition, when the term "recording medium" is used herein, it may include a case in which only the memory part 280c is included, a case in which only the external memory device 282 is included, or a case in which both the memory part 280c and the external memory device 282 are included.

(Substrate Processing Method)

Figure 9:
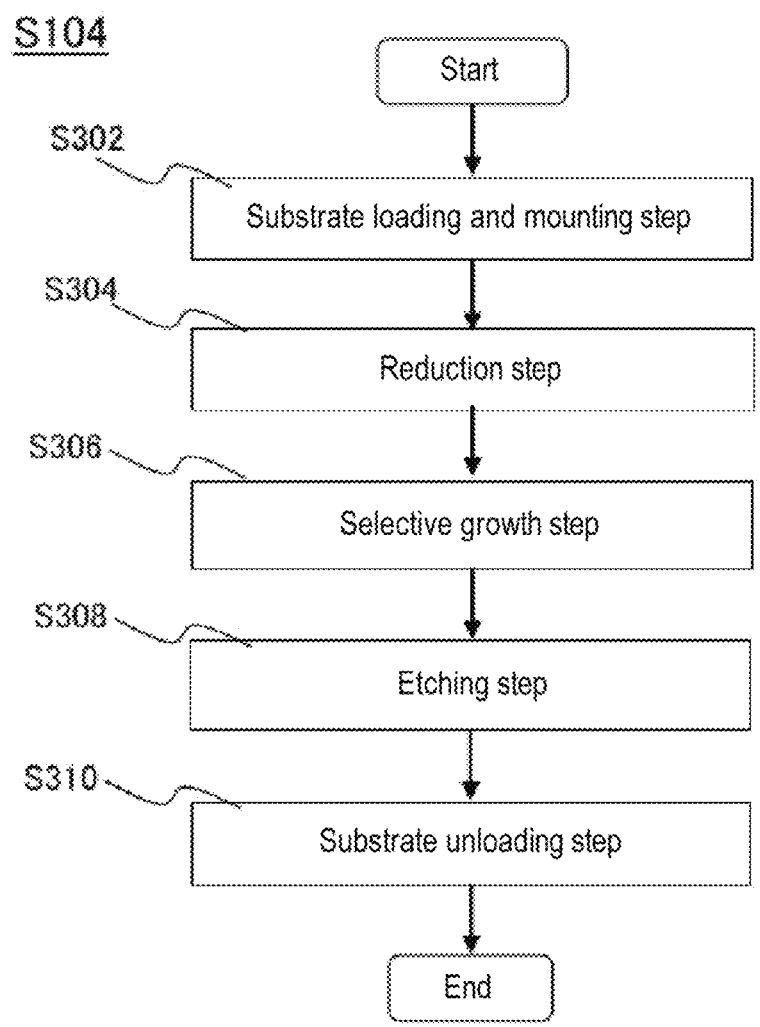
FIG. 9 is an explanatory view illustrating a flow of forming a second diffusion barrier film according to an embodiment.

Next, details of the second diffusion barrier film forming step S104 of the wafer 200 loaded into the substrate processing apparatus will be described with reference to FIG. 9. Further, the wafer 200 is in a state where the resist layer 2008 is removed from the state of FIG. 4B, and the copper-containing film 2005 is exposed.

Hereinafter, an example of forming the diffusion barrier film 2010 using an $H_2$ gas as a first process gas, a $WF_6$ gas as a second process gas, and an $NF_3$ gas as a third process gas will be described.

(Substrate Loading and Mounting Step S302)

In the processing apparatus 100, the substrate mounting table 212 is lowered to the transfer position of the wafer 200 to allow the lift pins 207 to pass through the through holes 214 of the substrate mounting table 212. As a result, the lift pins 207 are in a state where they protrude from the surface of the substrate mounting table 212 by a predetermined height. Subsequently, the gate valve 205 is opened to communicate the transfer space 203 with a transfer chamber (not shown). And then, the wafer 200 is loaded into the transfer space 203 and mounted above the lift pins 207 using a wafer transfer device (not shown). Thus, the wafer 200 is supported in a horizontal posture on the lift pins 207 that protrude from the surface of the substrate mounting table 212.

When the wafer 200 is loaded into the chamber 202, the wafer transfer device is retracted to the outside of the chamber 202, and the gate valve 205 is closed to make the inside of the chamber 202 airtight. Thereafter, the wafer 200 is mounted on the substrate mounting surface 211 provided on the substrate mounting table 212 by elevating the substrate mounting table 212. Further, the wafer 200 is elevated to the processing position (substrate processing position) within the process space 201 described above by elevating the substrate mounting table 212.

When the wafer 200 is elevated to the processing position within the process space 201 after it is loaded into the transfer space 203, the valve 266 is closed. Thus, the communication between the transfer space 203 and the TMP 265 is blocked, and the exhaust of the transfer space 203 by the TMP 265 is terminated. Meanwhile, the valve 275 is opened to allow the process space 201 and the APC 276 to communicate. The APC 276 adjusts the conductance of the exhaust pipe 263 to control the exhaust flow rate of the process space 201 by the DP 267, thus maintaining the process space 201 to a predetermined pressure (for example, a high vacuum of $10^{-5}$ to $10^{-1}$ Pa).

Further, when the wafer 200 is mounted on the substrate mounting table 212, it is controlled such that power is supplied to the heater 213 that is buried inside the substrate mounting table 212 to allow the surface of the wafer 200 to have a predetermined temperature. The temperature of the wafer 200 has a range of, for example, room temperature to 800 degrees C., preferably, a range of a room temperature to 700 degrees C. At this time, the temperature of the heater 213 is adjusted by determining a control value by the controller 280 based on temperature information detected by a temperature sensor and controlling a condition of current applying to the heater 213 by the heater temperature control part 220.

(Reduction Step S304)

Subsequently, the reduction step S304 is performed.

In the reduction step S304, an $H_2$ gas is supplied from the first gas supply system to the process space 201. Here, a natural oxide film or the like formed on the surface of the wafer 200 during transfer is removed. In particular, the exposed surface of the copper-containing film 2005 in the etched portion 2007a is cleaned. Since a reaction hindering substance between the exposed surface of the copper-containing film 2005 and the diffusion barrier film 2010 can be removed through cleaning, the reactivity with the diffusion barrier film 2010 can be increased in the entire exposed surface of the copper-containing film 2005. Thus, it is possible to uniformly form the diffusion barrier film 2010 on the exposed surface.

In the reduction step S304, the pressure of the process space 201 is set to have a range of 100 Pa to 1000 Pa, the temperature of the wafer 200 is set to have a range of 150 to 400 degrees C., and the flow rate of a hydrogen-containing gas is set to have a range of 1000 sccm to 3000 sccm.

(Selective Growth Step S306)

The selective growth step S306 of the wafer 200 that is loaded into the substrate processing apparatus will be described. The wafer in the state of FIG. 4B is processed in the selective growth step S306.

Hereinafter, an example of forming the second diffusion barrier film 2010 using an $H_2$ gas as a first process gas and a $WF_6$ gas as a second process gas will be described.

After the lapse of a predetermined period of time in the reduction step S304, the $WF_6$ gas is supplied from the second gas supply system, while continuously supplying the hydrogen-containing gas. The supplied $WF_6$ gas is thermally decomposed and supplied onto the wafer 200. Since the $WF_6$ gas has selectivity regarding film formation as described above, a tungsten film is not formed on the side surface 2002a or on the surface 2001a and the second diffusion barrier film 2010 having tungsten as a main ingredient is formed on the exposed surface of the copper-containing film 2005.

In this manner, as illustrated in FIG. 5, the width L of the void 2009 can be secured. Thus, it is possible to realize an air gap having low permittivity.

In the selective growth step S306, the pressure of the process space 201 is set to have a range of 1 Pa to 10 Pa, the temperature of the wafer 200 is set to have a range of 150 to 300 degrees C., the flow rate of the hydrogen-containing gas is set to have a range of 1000 sccm to 3000 sccm, and the flow rate of the $WF_6$ gas is set to have a range of 3 sccm to 100 sccm. The rate of the $WF_6$ gas is set to have a range of, for example, 0.1% to 3% of a mixture gas of the hydrogen-containing gas and the $WF_6$ gas.

When a predetermined period of time has lapsed, the supply of the $WF_6$ gas is stopped. The supply of the hydrogen-containing gas is continued. In this manner, by first stopping the supply of the $WF_6$ gas and then continuing the supply of the hydrogen-containing gas, it is possible to avoid an increase in partial pressure of the $WF_6$ gas and prevent a degradation of selectivity.

More preferably, any one of tungsten (W), tantalum (Ta), and molybdenum (Mo) which are difficult to react with copper among transition metals is used. For example, when titanium (Ti) is used as the transition metal, it may easily react with copper, compared with tungsten or the like. Due to this, there is a possibility that the Ti component of the copper-containing film 2005 is diffused to increase a resistance value of the copper-containing film 2005.

Meanwhile, since it is difficult for tungsten (W), tantalum (Ta), and molybdenum (Mo) to react with copper, it is difficult for each metal component to diffuse to copper, and thus, a resistance value is not increased.

(Etching Step S308)

However, during the selective growth step S306, process conditions or the like may be temporarily changed to break selectivity. In this case, as illustrated in FIG. 10, a stained film 2012 may be formed on the surface 2001a of the interlayer insulating film 2001 or on the side surface 2002a of the inter-wiring insulating film 2002, as well as on the exposed surface. In this state, if a step subsequent to the second interlayer insulating film forming step S105, which is a next step, is performed, the permittivity of the air gas is locally increased, degrading the characteristics of the air gap structure.

Thus, in this step, in order to remove the stained film 2012, the stained film 2012 is etched as follows.

After the lapse of a predetermined period of time in the selective growth step S306, the supply of the hydrogen-containing gas is stopped and the atmosphere is exhausted. After the exhaust, the valve 248d is opened to supply an etching gas to the process space 201. The supplied etching gas removes the film 2012.

In the etching step S308, the pressure of the process space 201 is set to have a range of 1 Pa to 10 Pa, the temperature of the wafer 200 is set to have a range of 150 to 300 degrees C., and the flow rate of the etching gas is set to have a range of 10 sccm to 1000 sccm.

(Substrate Unloading Step S310)

After the etching step S308 is completed, a substrate unloading step S310 is performed. In the substrate unloading step S310, the substrate mounting table 212 is lowered to allow the wafer 200 to be supported on the lift pins 207 that protrude from the surface of the substrate mounting table 212. Thus, the wafer 200 is placed in the transfer position from the processing position.

Subsequently, when the wafer 200 is moved to the transfer position, the valve 275 is closed to block the communication between the transfer space 203 and the exhaust pipe 264. Meanwhile, the valve 266 is opened to exhaust the atmosphere of the transfer space 203 by the TMP 265 (and the DP 267), thereby maintaining the chamber 202 in a high vacuum (ultra-high vacuum) state (for example, $10^{-5}$ Pa or less) and reducing the pressure difference from the transfer chamber, which is similarly maintained in a high vacuum (ultra-high vacuum) state (for example, $10^{-6}$ Pa or less). When a predetermined pressure is reached, the wafer 200 is unloaded by an arm (not shown).

Second Embodiment

Next, a second embodiment will be described.

The second embodiment is different from the first embodiment in the following aspect.

A first difference is that the second gas is different. A second difference is that the step of forming the second diffusion barrier film is different.

Hereinafter, a specific example will be described based on the differences from the first embodiment with reference to FIGS. 11 to 13. Also, a description of the same contents as those of the first embodiment will be omitted.

This step aims at forming a second interlayer insulating film 2015 as illustrated in FIG. 11B on the wafer 200 in a state where the resist layer 2008 of FIG. 4B has been removed.

FIGS. 11A and 11B correspond to FIG. 5. Here, the wafer 200 in a state where the resist layer has been removed in FIGS. 4A and 4B is processed in the second diffusion barrier film forming step S104 of this embodiment to form a silicon-containing film 2013 as illustrated in FIG. 11A, and thereafter, the silicon-containing film 2013 is modified to form the second diffusion barrier film 2015 as illustrated in FIG. 11B.

Figure 12:
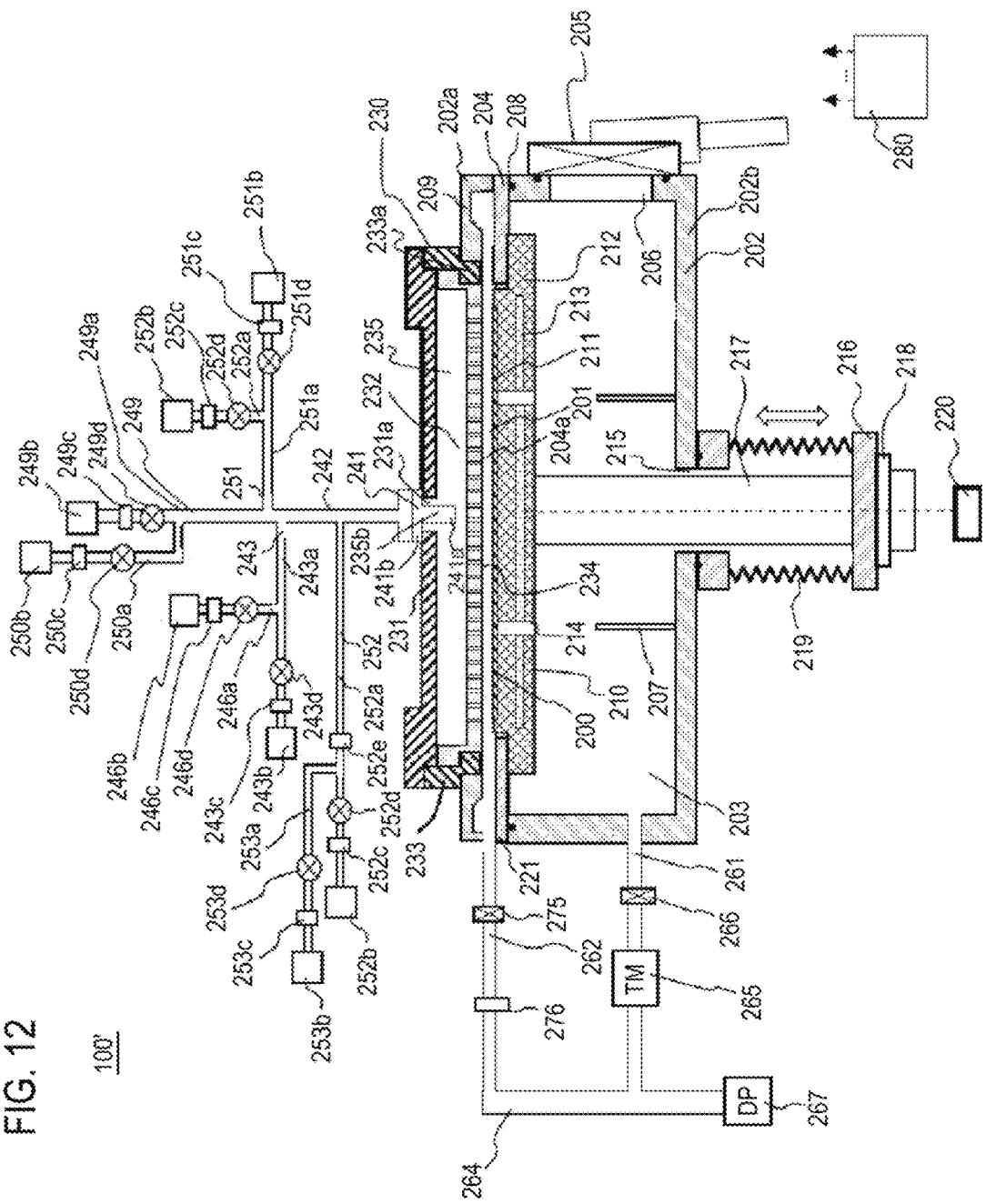
FIG. 12 is an explanatory view illustrating a substrate processing apparatus according to an embodiment.

Further, FIG. 12 is a view illustrating a substrate processing apparatus 100' for realizing the second diffusion barrier film forming step of this embodiment. FIG. 13 corresponds to FIG. 9, and is a view illustrating the second diffusion barrier film forming step S104 of this embodiment.

The wafer 200 processed in this embodiment is in a state where a portion of the surface of the copper-containing film 2005 is exposed during the patterning step, as in the first embodiment illustrated in FIGS. 4A and 4B.

First, a state of the wafer 200 based on substrate processing according to the second embodiment will be described with reference to FIGS. 11A and 11B. In this step, the silicon-containing film 2013 of FIG. 11A is formed, and thereafter, the silicon-containing film 2013 is modified to form the second diffusion barrier film 2015 of FIG. 11B.

Next, a method for forming the second diffusion barrier film 2015 and a substrate processing apparatus for realizing the same will be described.

(Substrate Processing Apparatus)

Here, the substrate processing apparatus 100' will be described with reference to FIG. 12. Compared with the substrate processing apparatus 100 of the first embodiment, in the substrate processing apparatus 100', the configurations of the second gas supply system and the third gas supply system are different and a fourth gas supply system is newly added. Hereinafter, the differences of the substrate processing apparatus 100' from the substrate processing apparatus 100 will be described in detail. Also, a description of the same components having the same reference numerals as those of the substrate processing apparatus 100 will be omitted.

(Second Gas Supply System)

A second gas supply system 249 of the second embodiment will be described.

A second gas supply source 249b, an MFC 249c, which is a flow rate controller (flow rate control part), and a valve 249d, which is an opening/closing valve, are installed in the second gas supply pipe 249a in this order from the upstream direction.

A gas containing a second element (hereinafter, referred to as a "second element-containing gas") as a second gas is supplied from the second gas supply pipe 249a into the shower head 230 though the MFC 249c, the valve 249d, and the common gas supply pipe 242.

The second element-containing gas is one of the process gases. The second element-containing gas has selectivity regarding film formation in that it easily grows a film on the copper-containing film 2005 while having difficulty in growing a film on the inter-wiring insulating film 2002. In other words, the second element-containing gas is a gas that can be selectively grown on the copper-containing film 2005. For example, the second element-containing gas is a gas containing a silicon component.

Here, the second element-containing gas contains a second element different from the first element. The second element is a silicon-containing gas, and is, for example, disilane ($Si_2H_6$).

The second element-containing gas supply system 249 (also referred to as a silicon-containing gas supply system) is mainly configured by the second gas supply pipe 249a, the MFC 249c, and the valve 249d.

Further, a downstream end of the second inert gas supply pipe 250a is connected to the second gas supply pipe 249a at a downstream side of the valve 249d. An inert gas supply source 250b, an MFC 250c, which is a flow rate controller (flow rate control part), and a valve 250d, which is an opening/closing valve, are installed in the second inert gas supply pipe 250a in this order from the upstream direction.

An inert gas is supplied from the second inert gas supply pipe 250a into the shower head 230 through the MFC 250c, the valve 250d, and the second gas supply pipe 249a. The inert gas acts as a carrier gas or a dilution gas in the second diffusion barrier film forming step S104.

A second inert gas supply system is mainly configured by the second inert gas supply pipe 250a, the MFC 250c, and the valve 250d. Also, it may be considered that the inert gas supply source 250b is included in the second inert gas supply system.

In addition, it may also be considered that the second gas supply source 250b and the second inert gas supply system are included in the second element-containing gas supply system 249.

(Third Gas Supply System)

A third gas supply source 251b, an MFC 251c, which is a flow rate controller (flow rate control part), and a valve 251d, which is an opening/closing valve, are installed in the third gas supply pipe 251a in this order from the upstream direction.

An inert gas as a purge gas is supplied from the third gas supply pipe 251a into the shower head 230 though the MFC 250c, the valve 250d, and the common gas supply pipe 242.

Here, the inert gas is, for example, a nitrogen ($N_2$) gas. Also, as the inert gas, a rare gas such as, for example, a helium (He) gas, a neon (Ne) gas, or an argon (Ar) gas, in addition to the $N_2$ gas, may be used.

A downstream end of an etching gas supply pipe 252a is connected to the third gas supply pipe 251a at a downstream side of the valve 251d. An etching gas supply source 252b, an MFC 252c, which is a flow rate controller (flow rate control part), and a valve 252d, which is an opening/closing valve, are installed in the etching gas supply pipe 252a in this order from the upstream direction. The etching gas has the property of removing the silicon-containing film, and is, for example, a chloride-containing gas, which is an HCl gas.

A third gas supply system 251 is mainly configured by the third gas supply pipe 251a, the MFC 251c, and the valve 251d.

Further, an etching gas supply system is mainly configured by the etching gas supply pipe 252a, the MFC 252c, and the valve 252d. Also, it may be considered that the etching gas supply source 252b and the third gas supply pipe 251a are included in the etching gas supply system.

In addition, it may be considered that the third gas supply source 251b and the etching gas supply system are included in the third gas supply system 251.

In a selective growth step S406, an inert gas is supplied from the third gas supply pipe 251a into the shower head 230 through the MFC 251c, the valve 251d, and the common gas supply pipe 242. Further, in the etching step, an etching gas is supplied into the shower head 230 through the MFC 252c, the valve 252d, and the common gas supply pipe 242.

In the substrate processing process, the inert gas supplied from the inert gas supply source 251b acts as a purge gas for purging a gas collected in the chamber 202 or the shower head 230. Also, in the etching step, the inert gas may act as a carrier gas or a dilution gas of the etching gas.

In the etching step, the etching gas supplied from the etching gas supply source 252b etches a silicon-containing film having a strained shape (or island shape) formed on the wafer 200.

(Fourth Gas Supply System)

Next, a fourth gas supply system 252 will be described.

A fourth gas supply source 252b, an MFC 252c, which is a flow rate controller (flow rate control part), a valve 252d, which is an opening/closing valve, and a remote plasma unit 252e are installed in the fourth gas supply pipe 252a in this order from the upstream direction.

A nitridation gas used in a modifying step S410 is supplied from the fourth gas supply pipe 252a into the shower head 230 though the MFC 252c, the valve 252d, the remote plasma unit 252e, and the common gas supply pipe 242.

Here, the nitridation gas is, for example, an ammonia ($NH_3$) gas. Also, as the nitridation gas, for example, a nitrogen ($N_2$) gas or the like, in addition to the $NH_3$ gas, may be used.

A downstream end of an inert gas supply pipe 253a is connected to the fourth gas supply pipe 252a at a downstream side of the valve 252d. An inert gas supply source 253b, an MFC 253c, which is a flow rate controller (flow rate control part), and a valve 253d, which is an opening/closing valve, are installed in the inert gas supply pipe 253a in this order from the upstream direction.

The fourth gas supply system 252 is mainly configured by the fourth gas supply pipe 252a, the MFC 252c, the valve 252d, and the remote plasma unit 252e.

Further, an inert gas supply system is mainly configured by the inert gas supply pipe 253a, the MFC 253c, and the valve 253d. Also, it may be considered that the inert gas supply source 253b and the fourth gas supply pipe 253a are included in the inert gas supply system.

In addition, it may also be considered that the fourth gas supply source 252b and the inert gas supply system are included in the fourth gas supply system 252.

Subsequently, details of the second diffusion barrier film forming step S104 in the second embodiment will be described with reference to FIG. 13. Further, a substrate loading and mounting step S402 is the same as the substrate loading and mounting step S302, a reduction step S404 is the same as the reduction step S304, and a substrate unloading step S408 is the same as the substrate unloading step S310, and thus, a description thereof will be omitted.

(Selective Growth Step S406)

The selective growth step S406 of the wafer 200 that is loaded into the substrate processing apparatus will be described. The wafer in a state where the resist layer 2008 has been removed from the state of FIG. 4B, is processed in the selective growth step S406.

Hereinafter, an example of forming the silicon-containing film 2013 using an $H_2$ gas as a first process gas and an $Si_2H_6$ gas as a second process gas and modifying the silicon-containing film 2013 to form the second diffusion barrier film 2015 will be described.

After the lapse of a predetermined period of time in the reduction step S404, the $Si_2H_6$ gas is supplied from the second gas supply system, while continuously supplying the hydrogen-containing gas. The supplied $Si_2H_6$ gas is thermally decomposed and supplied onto the wafer 200. The $Si_2H_6$ gas forms the silicon-containing film 2013 on the exposed surface of the copper-containing film 2005. After the lapse of a predetermined period of time, the supply of the $Si_2H_6$ gas is stopped.

In the selective growth step S406, the pressure of the process space 201 is set to have a range of 1 Pa to 10 Pa, the temperature of the wafer 200 is set to have a range of 150 to 300 degrees C., and the flow rate of the silicon-containing gas is set to have a range of 10 sccm to 1000 sccm.

(Etching Step S408)

However, during the selective growth step S406, due to the issue of selectivity, a stained film 2014 is formed on the surface 2001a of the interlayer insulating film 2001 or on the side surface 2002a of the inter-wiring insulating film 2002, as well as on the exposed surface of the copper-containing film 2005. In this state, if a step subsequent to the second interlayer insulating film forming step S105, which is a next step, is performed, the permittivity of the air gas is locally increased, degrading the characteristics of the air gap structure.

Thus, in this step, in order to remove the stained film 2014, the stained film 2014 is etched as follows.

Specifically, after the lapse of a predetermined period of time in the selective growth step S406, the supply of the $Si_2H_6$ gas is stopped and the atmosphere is exhausted. After the exhaust, the valve 248d is opened to supply an etching gas to the process space 201. The supplied etching gas removes the film 2012.

In the etching step S408, the pressure of the process space 201 is set to have a range of 1 Pa to 10 Pa, the temperature of the wafer 200 is set to have a range of 150 to 300 degrees C., and the flow rate of the etching gas is set to have a range of 10 sccm to 1000 sccm.

(Modifying Step S410)

Hereinafter, the modifying step S410 will be described. However, in general, it is known that a silicon component is easy to be diffused to copper in a high temperature state of about 400 degrees C. In this embodiment, there is a possibility that a silicon component included in the silicon-containing film 2013 formed at the exposed portion of the copper-containing film 2005 formed of copper is diffused to the copper-containing film 2005.

Since the silicon component-diffused copper-containing film has an increased resistance value, the performance as a wiring is degraded. Thus, more preferably, the silicon-containing film 2013 is modified to suppress diffusion of the silicon component.

Next, a specific example of a method for modifying the silicon-containing film 2013 in the modifying step S410 will be described. When the selective growth step S406 and the etching step S408 are terminated by shutting the valves of the first gas supply system 243, the second gas supply system 244, and the third gas supply system 245 and by stopping the supply of the gases supplied from each of the gas supply systems, the valve 252d is opened to initiate the supply of an ammonia (NH₃) gas. At this time, the remote plasma unit 252e has been already started up.

The ammonia gas which has passed through the remote plasma unit 252e becomes plasma, and the ammonia gas in a plasma state is supplied onto the wafer 200. In the wafer 200, the silicon-containing film 2013 and ammonia plasma react with each other to nitride the silicon-containing film to form the second diffusion barrier film 2015. Nitriding of the silicon-containing film 2013 can increase coupling between the silicon component and the nitrogen component, thus suppressing diffusion of the silicon component. After the lapse of a predetermined period of time, the supply of the ammonia gas is stopped.

Here, the reason for nitriding using the plasma of the nitrogen-containing gas will be described. As mentioned above, it is known that the silicon component easily diffuses to the copper-containing film in a high temperature state. Meanwhile, in the case of nitriding, it is known that a high level of energy is required. Thus, for example, in the case of supplementing reaction energy by high heat, the wafer 200 is required to be heated at a higher temperature. However, when the wafer 200 has a high temperature, a problem arises in that silicon is diffused to increase a resistance value of the copper-containing film 2005 as mentioned above. The copper-containing film 2005 is used as a wiring later, and in order to effectively allow current flow, the resistance value is desirably as low as possible.

Thus, it is required to perform nitriding at a temperature at which diffusion of the silicon component to the copper-containing film is suppressed. Accordingly, in order to avoid nitriding with the wafer 200 at a high temperature, the nitrogen-containing gas is converted into plasma to supplement energy required for reaction with the plasma, thus nitriding the silicon-containing film.

Here, as process conditions in the modifying step S410, in this step, a supply amount of the NH₃ gas is set to have a range of, for example, 10 sccm to 1000 sccm, preferably, 10 to 500 sccm. A time duration for which the NH₃ gas is supplied to the wafer 200 may be set to have a range of, for example, 1 to 600 seconds, preferably, 1 to 120 seconds. Also, the temperature of the wafer 200 may be set to have a range of, for example, 200 to 400 degrees C., preferably, 300 to 380 degrees C.

In this manner, the first diffusion barrier film and the second diffusion barrier film can be formed in a state where the width L of the void 2009 is secured as illustrated in FIGS. 11A and 11B. Thus, it is possible to prevent diffusion of the copper component and realize an air gap having low permittivity.

Also, in this embodiment, the example in which the Si₂H₆ gas is used as the silicon-containing gas has been described, but the present disclosure is not limited thereto, and for example, a monosiliane (SiH₄) gas or a mixture gas thereof may also be used.

(Main Effects)

The main effects of the foregoing embodiments will be described below.

(a) By forming the second diffusion barrier film, even though the copper-containing film is exposed in the etching step, it is possible to suppress diffusion of the metal component to the upper layer.

(b) By forming the second diffusion barrier film, even though the copper-containing film is exposed in the etching process, it is possible to suppress the conduction with the adjacent copper-containing film.

According to the present disclosure in some embodiments, it is possible to provide a technique of realizing excellent characteristics in a semiconductor device having an air gap formed thereon.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:

loading, into a process chamber, a substrate including a first wiring layer having a first interlayer insulating film, a plurality of copper-containing films formed on the first interlayer insulating film and used as a wiring, an inter-wiring insulating film insulating between the plurality of copper-containing films, and a void formed between the plurality of copper-containing films, and a first diffusion barrier film formed on a portion of an upper surface of the copper-containing films to suppress diffusion of a component of the copper-containing films; and forming a second diffusion barrier film configured to suppress diffusion of a component of the copper-containing films on a surface of another portion, on which the first diffusion barrier film is not formed, in the copper-containing films, wherein, in the act of forming the second diffusion barrier film, a metal-containing gas having a property of selecting the copper-containing film, rather than selecting the inter-wiring insulating film, is supplied to the substrate to form the second diffusion barrier film on the surface of another portion.

2. The method of claim 1, wherein, in the act of forming the second diffusion barrier film, a hydrogen-containing gas is further supplied to the substrate.

3. The method of claim 2, wherein, in the act of forming the second diffusion barrier film, the hydrogen-containing gas is supplied to the substrate, and thereafter, the metal-containing gas is supplied thereto.

4. The method of claim 3, wherein, in the act of forming the second diffusion barrier film, the supply of the hydrogen-containing gas is stopped after the supply of the metal-containing gas is stopped.

5. The method of claim 2, wherein, in the act of forming the second diffusion barrier film, the supply of the hydrogen-containing gas is stopped after the supply of the metal-containing gas is stopped.

6. The method of claim 1, wherein the metal-containing gas is a transition metal-containing gas.

7. The method of claim 6, wherein, in the act of forming the second diffusion barrier film, a hydrogen-containing gas is further supplied to the substrate.

8. The method of claim 7, wherein, in the act of forming the second diffusion barrier film, the hydrogen-containing gas is supplied to the substrate, and thereafter, the metal-containing gas is supplied thereto.

9. The method of claim 8, wherein, in the act of forming the second diffusion barrier film, the supply of the hydrogen-containing gas is stopped after the supply of the metal-containing gas is stopped.

10. The method of claim 7, wherein, in the act of forming the second diffusion barrier film, the supply of the hydrogen-containing gas is stopped after the supply of the metal-containing gas is stopped.

11. The method of claim 1, wherein a metal component in the metal-containing gas is any one of tungsten, tantalum, and molybdenum.

12. The method of claim 11, wherein, in the act of forming the second diffusion barrier film, a hydrogen-containing gas is further supplied to the substrate.

13. The method of claim 12, wherein, in the act of forming the second diffusion barrier film, the hydrogen-containing gas is supplied to the substrate, and thereafter, the metal-containing gas is supplied thereto.

14. The method of claim 13, wherein, in the act of forming the second diffusion barrier film, the supply of the hydrogen-containing gas is stopped after the supply of the metal-containing gas is stopped.

15. The method of claim 12, wherein, in the act of forming the second diffusion barrier film, the supply of the hydrogen-containing gas is stopped after the supply of the metal-containing gas is stopped.

16. The method of claim 1, wherein the first diffusion barrier film is a silicon-containing film, and the second diffusion barrier film is a metal-containing film.

17. The method of claim 16, wherein, in the act of forming the second diffusion barrier film, a hydrogen-containing gas is further supplied to the substrate.

18. The method of claim 17, wherein, in the act of forming the second diffusion barrier film, the hydrogen-containing gas is supplied to the substrate, and thereafter, the metal-containing gas is supplied thereto.

19. The method of claim 18, wherein, in the act of forming the second diffusion barrier film, the supply of the hydrogen-containing gas is stopped after the supply of the metal-containing gas is stopped.

20. The method of claim 17, wherein, in the act of forming the second diffusion barrier film, the supply of the hydrogen-containing gas is stopped after the supply of the metal-containing gas is stopped.

* * * * *